United States Patent
Alfke

(10) Patent No.: US 7,227,387 B1
(45) Date of Patent: Jun. 5, 2007

(54) MEASURING PULSE EDGE DELAY VALUE RELATIVE TO A CLOCK USING MULTIPLE DELAY DEVICES TO ADDRESS A MEMORY TO ACCESS THE DELAY VALUE

(75) Inventor: Peter H. Alfke, Los Altos Hills, CA (US)

(73) Assignee: Xilinx, Inc., San Jose, CA (US)

( * ) Notice: Subject to any disclaimer, the term of this patent is extended or adjusted under 35 U.S.C. 154(b) by 70 days.

(21) Appl. No.: 11/128,775

(22) Filed: May 13, 2005

(51) Int. Cl.
*H03K 5/22* (2006.01)
(52) U.S. Cl. .............................. 327/26; 327/31; 327/38
(58) Field of Classification Search ................ 327/26, 327/27, 31, 33, 18, 19, 24, 38
See application file for complete search history.

(56) References Cited

U.S. PATENT DOCUMENTS

| | | | | |
|---|---|---|---|---|
| 5,138,320 A | * | 8/1992 | Ngo et al. ................... | 341/173 |
| 5,223,742 A | * | 6/1993 | Schumacher ................. | 327/31 |
| 5,581,204 A | * | 12/1996 | Olsen .......................... | 327/31 |
| 5,598,116 A | * | 1/1997 | Kwon .......................... | 327/31 |
| 5,646,565 A | * | 7/1997 | Tukidate ..................... | 327/174 |
| 5,689,539 A | * | 11/1997 | Murakami ................... | 377/20 |
| 5,812,626 A | * | 9/1998 | Kusumoto et al. ........... | 377/20 |
| 5,913,159 A | * | 6/1999 | Muirhead et al. ........ | 455/226.4 |
| 5,923,191 A | * | 7/1999 | Nemetz et al. ............... | 327/20 |
| 6,590,495 B1 | | 7/2003 | Behbehani ................... | 340/435 |

OTHER PUBLICATIONS

Xilinx, Inc.; *Virtex-4 FPGA Handbook*; Published Aug. 2004; available from Xilinx, Inc., 2100 Logic Drive, San Jose, California 95124; pp. 355-358.

* cited by examiner

*Primary Examiner*—Timothy P. Callahan
*Assistant Examiner*—Hai L. Nguyen
(74) *Attorney, Agent, or Firm*—Thomas A. Ward

(57) ABSTRACT

A pulse width measurement system is provided with components in an FPGA so that pulse widths can be measured that are smaller than the frequency limits of the FPGA system clock. For the measurement, an incoming pulse is fed into the FPGA to many (e.g. 32) I/O inputs in parallel. Each parallel input is then provided to a programmable delay device with each delay configured to a different ascending delay value. The input transition time is then detected by converting the outputs from the delay devices into data indicating the timing information. In one embodiment the outputs of the delay devices address data stored in BRAMs for later processing in the FPGA to determine the timing information.

14 Claims, 6 Drawing Sheets

MEASURING PULSE EDGE DELAY VALUE RELATIVE TO A CLOCK USING MULTIPLE DELAY DEVICES TO ADDRESS A MEMORY TO ACCESS THE DELAY VALUE

BACKGROUND

1. Technical Field

The present invention relates to a configuration of circuit components in an integrated circuit (IC) to enable use of the IC to measure pulse width relative to the frequency of the system clock in the IC. More particularly, the present invention relates to measuring time delay from transmission until receipt of a signal.

2. Related Art

A simple method to measure pulse width in an IC is to use a free running counter connected to the IC system clock. Circuitry is connected to the counter that detects the beginning transition of the pulse to start the counter, and then to detect the next transition of the pulse to stop the counter. The count then gives an accurate measurement of the pulse width.

A problem using a counter and system clock to measure a pulse width occurs when the delay is small and approaches the limits of the system clock frequency. In a typical IC, such as a Field Programmable Gate Array (FPGA), it is difficult to have a clock speed exceeding 1 GHz, leading to measurement resolution accuracy limits when pulses are on the order of 10 nanosecond or less.

A number of systems require measurement of pulses less than 10 ns. An example of such a system is a collision avoidance system for automobiles. Measurement of pulses to the order of 100 picoseconds enables measuring the distance to close-by objects with a resolution on the order of centimeters. A typical collision avoidance system can measure small distances on the order of centimeters to keep a safe distance from cars that a host vehicle is following in traffic.

Two different types of collision avoidance sensing systems are typically used as illustrated in U.S. Pat. No. 6,590,495 entitled "Automobile Distance Warning and Alarm System." A first type system uses a rangefinder that includes a laser pulsed-echo sensor. The laser operates at a high frequency and can generate short pulses enabling measurement of short distances easily, such as when following another automobile in traffic. The laser sensor is also relatively compact and can be concealed, such as in the grill area of a car. The laser device has some deficiencies such as penetrating fog or operating over longer distances. A second type system is a radar system that uses lower frequency radar components to form a rangefinder. The lower frequency radar signals still typically operate with a frequency range on the order of 1 GHz and higher, but work well over a longer distance and better through fog than laser rangefinders. The lower frequency radar antennas, however, typically require large horn antennas that are not easily mounted or concealed in a vehicle. With a limit on system clock frequencies in ICs, a standard IC chip like an FPGA used to measure distance will only marginally determine distances for a radar system, and will likely be unusable for some pulse-laser systems that require measurement resolution of better than 10 ns.

FIG. 1 illustrates components of a typical automobile distance warning system that uses a pulsed-laser range finder for distance measurement. The components include a range finder 102, a time measuring circuit 104 and a microcontroller 106. The range finder 102 illustrated is a laser pulse-echo device that can be mounted on the front of a car to detect vehicles or objects to be avoided. The time measuring circuit 104 includes a transmitter 114 that sends signals to cause the pulsed infrared laser diode 110 to send out pulses. The infrared photo transistor 112 receives reflected pulses and provides them to receiver 116. Illustratively, the transmitter 114 operates at a pulse repetition rate of 10 MHz so that one pulse is emitted every 100 nanoseconds.

With the transmitted and reflected laser pulses provided, a digital clock 117 and a counter 118 are used to determine the time interval between the initiation of the transmitted pulse and the return of the reflected pulse. In particular, a signal from a transmitter 114 in time measurement circuit 104 causes counter 118 to begin counting clock pulses when an infrared pulse is emitted by the laser diode 110; and a signal from receiver 116 causes counter 118 to stop counting when the reflected infrared pulse is received by receiver 116. The count in counter 118 is proportional to the separation distance from the host vehicle to the detected object. Time measuring circuit 104 provides the count from counter 118 to microcontroller for calculation of the separation distance from the host vehicle to the object detected. The microcontroller 106 then functions to control the vehicle speed or alert the operator of a possible collision.

With collision avoidance systems, as well as other systems that require pulse width measurement, it may be desirable to measure pulse separations of 10 ns or less. It is thus desirable to provide a system in an IC having a maximum clock speed that can provide for measurement of pulse separations less than measurable directly from the available clock count in the IC.

SUMMARY

According to embodiments of the present invention, a system is provided for an IC to measure pulse widths that are smaller than the resolution offered directly by the system clock.

In the measurement system an incoming pulse transition provided to the IC is fed to many (e.g. 32) inputs in parallel. Each parallel input is then provided to a delay device with each delay configured to a different value. The input transition time is then detected by converting the parallel delay device output data to indicate accurate timing information.

In one embodiment, the delay device used is provided as part of each input buffer in a FPGA. One FPGA providing a programmable delay device at each input is the Virtex-4 FPGA manufactured by Xilinx, Inc. of San Jose, Calif. An input signal for determining delay is distributed to multiple FPGA I/O pins to multiple programmable delay devices. Delays in the FPGA input buffer delay devices are set to various values, for example with each sequential delay device adding an additional 80 picoseconds delay to the input pulse signal. With the input pulse being all high, the delay device outputs will remain all ones. Similarly, with the input pulse low, the delay device outputs will remain all zeros. If instead, however, the input transitions between a zero to a one, and the transition does not fall directly on a clock edge, the output of the delay devices will be a combination of ones and zeros, such as 00011111111 with the delay devices at the transition between 0 and 1 indicating the moment of pulse transition.

In one embodiment, the various delay device outputs are provided to registers or flip-flops and then to a memory to determine signal delay. In one embodiment, the memory is formed using the dual-ported Block Random Access Memory (BRAMs) or similar dual ported BlockROMs provided in an FPGA. Although the BRAMs must be addressed by a larger output word from the delay devices than a single BRAM can handle, the BRAMs are combinable according to the present invention to handle a larger word by overlapping some address bits. An on board microcontroller in the FPGA can then process the data stored in memory to accurately determine the receipt time of the incoming pulse.

BRIEF DESCRIPTION OF THE DRAWINGS

Further details of the present invention are explained with the help of the attached drawings in which.

DETAILED DESCRIPTION

The delay circuits and other components for implementing embodiments of the present invention can be implemented within a single FPGA. Although an FPGA is described as including the components, it is understood that either one or more other ICs types can similarly include the components. Although other ICs can be used, for convenience, subsequent discussion of embodiments of the present invention will refer to components provided in an FPGA.

Figure 1:
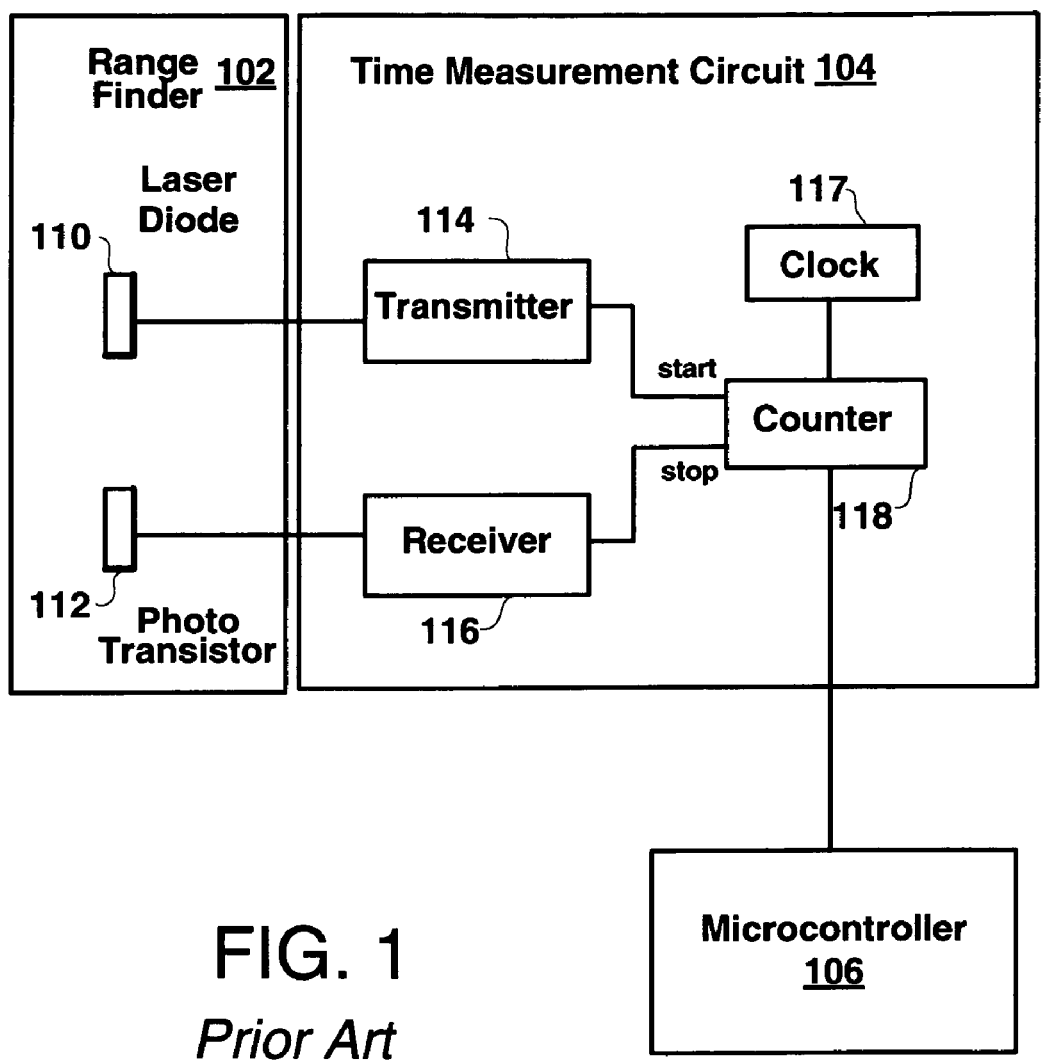
FIG. 1 illustrates components of a typical automobile distance warning system.
Figure 2:
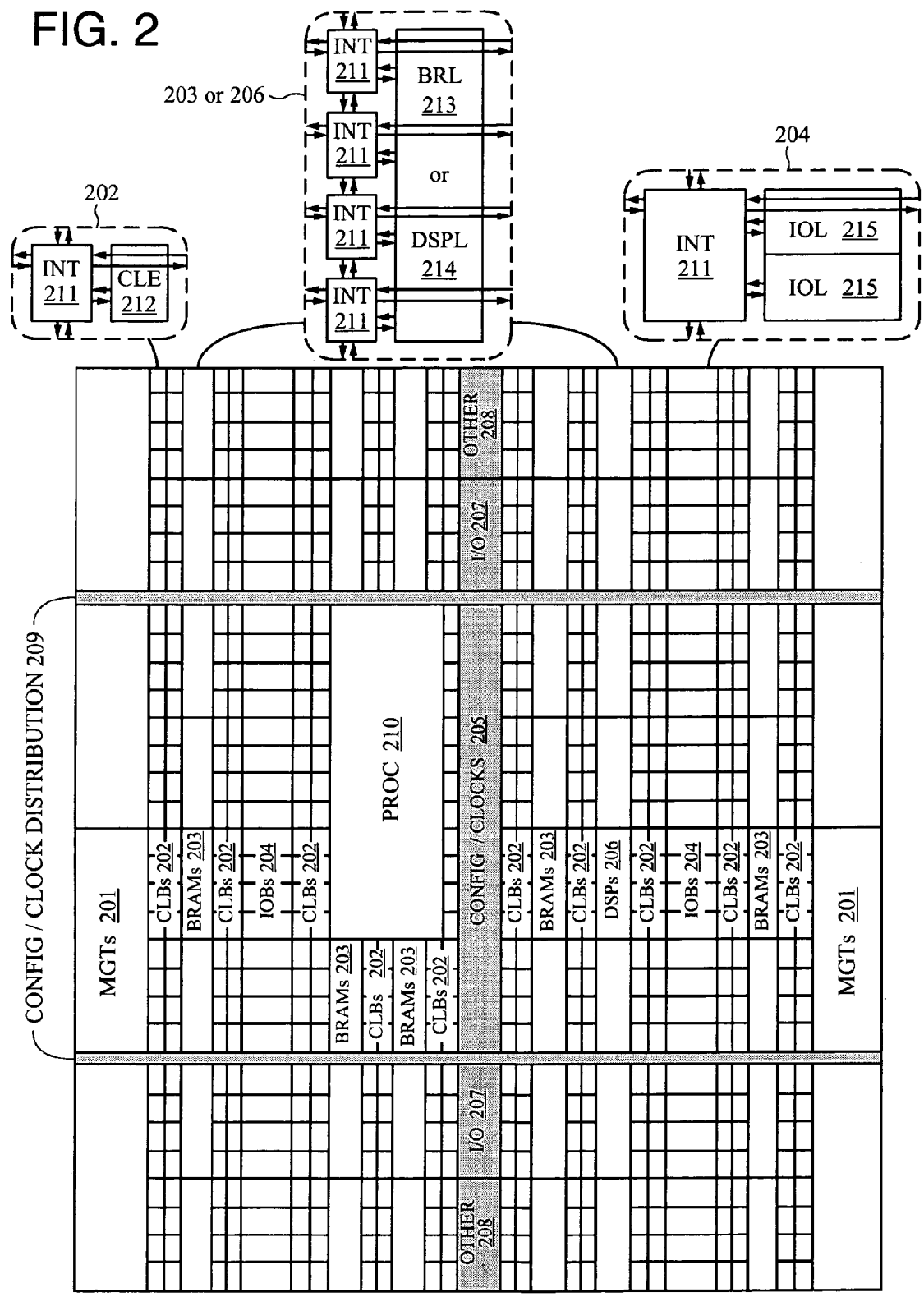
FIG. 2 illustrates one configuration of components in an FPGA.

FIG. 2 illustrates for reference one configuration of components that can be included in an FPGA. The components include a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. The FPGA can also include a dedicated processor blocks (PROC 210).

Each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
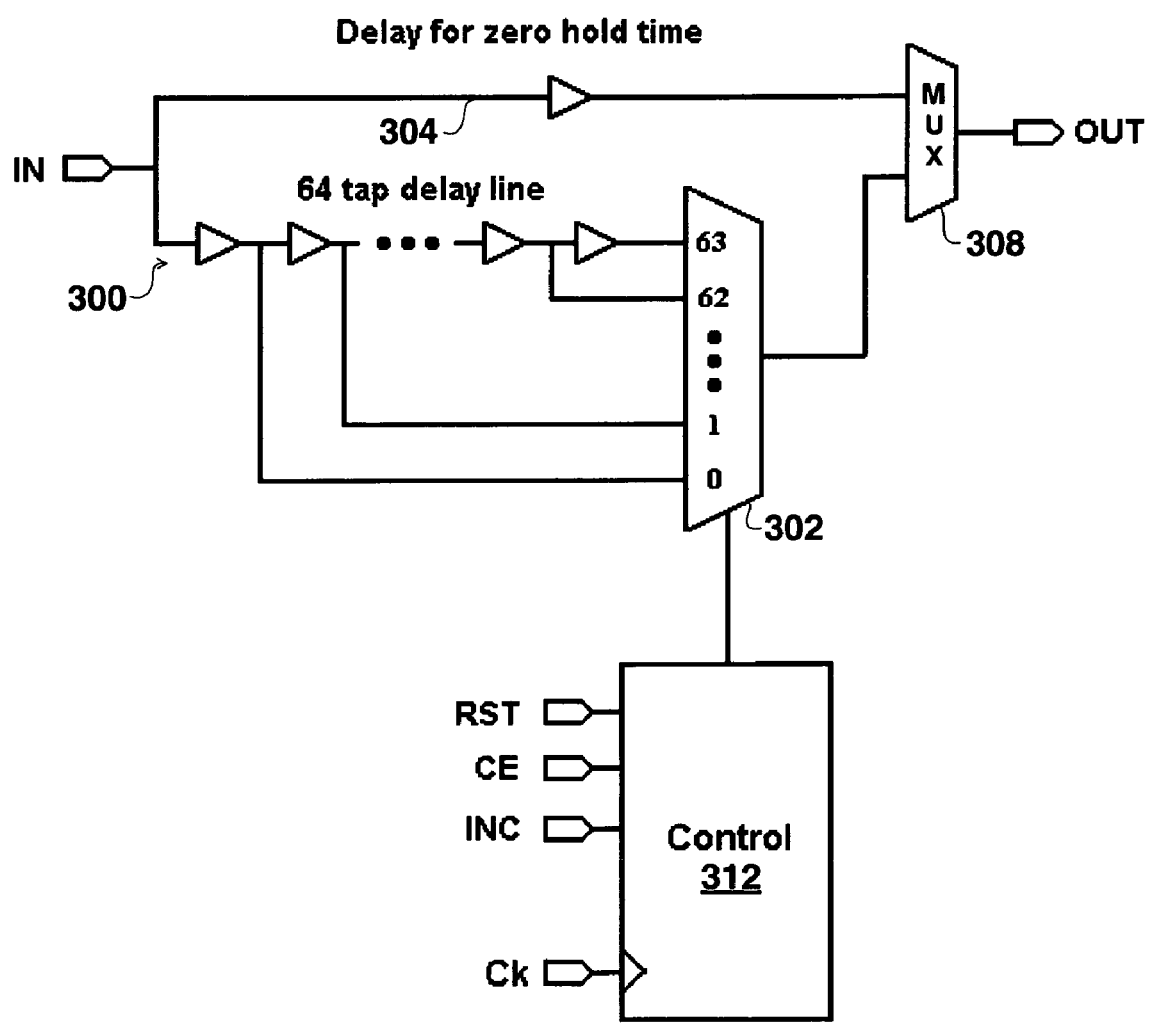
FIG. 3 shows a block diagram of components of a programmable delay circuit.

FIG. 3 shows a block diagram of components of a programmable delay circuit that can be used with embodiments of the present invention. Similar circuitry to that shown in FIG. 3 is included in the IOBs of the Virtex-4 family of FPGAs manufactured by Xilinx, Inc., of San Jose, Calif. Although the delay circuit of FIG. 3 is described herein, it is understood that alternative delay circuit configurations known in the art can be used to provide a variable delay in an IC for embodiments of the present invention.

The delay circuit of FIG. 3 includes a 64 tap delay line made up of buffers 300 having taps connecting the outputs of the buffers 300 to 64 inputs of a multiplexer 302. The series buffers 64 provide one path from the data input IN, while a second path 306 is provided through a single buffer when a programmable delay is not desired. The second path 304, and the output of multiplexer 302 are provided as inputs of another multiplexer 308. The output of the multiplexer 308 then provides the overall output OUT for the delay circuit of FIG. 3.

A control circuit 312 provides a select input to the multiplexer 302 to select a desired delay. In one embodiment, the delay provided by each buffer 300 is set to 80 picoseconds. The control inputs CE and INC, allow a user to increment and decrement the amount of absolute delay inserted into the data path in the discrete steps of 80 ps. The control inputs RST and Ck, provide the reset and clock inputs to the control circuit 312.

Figure 4:
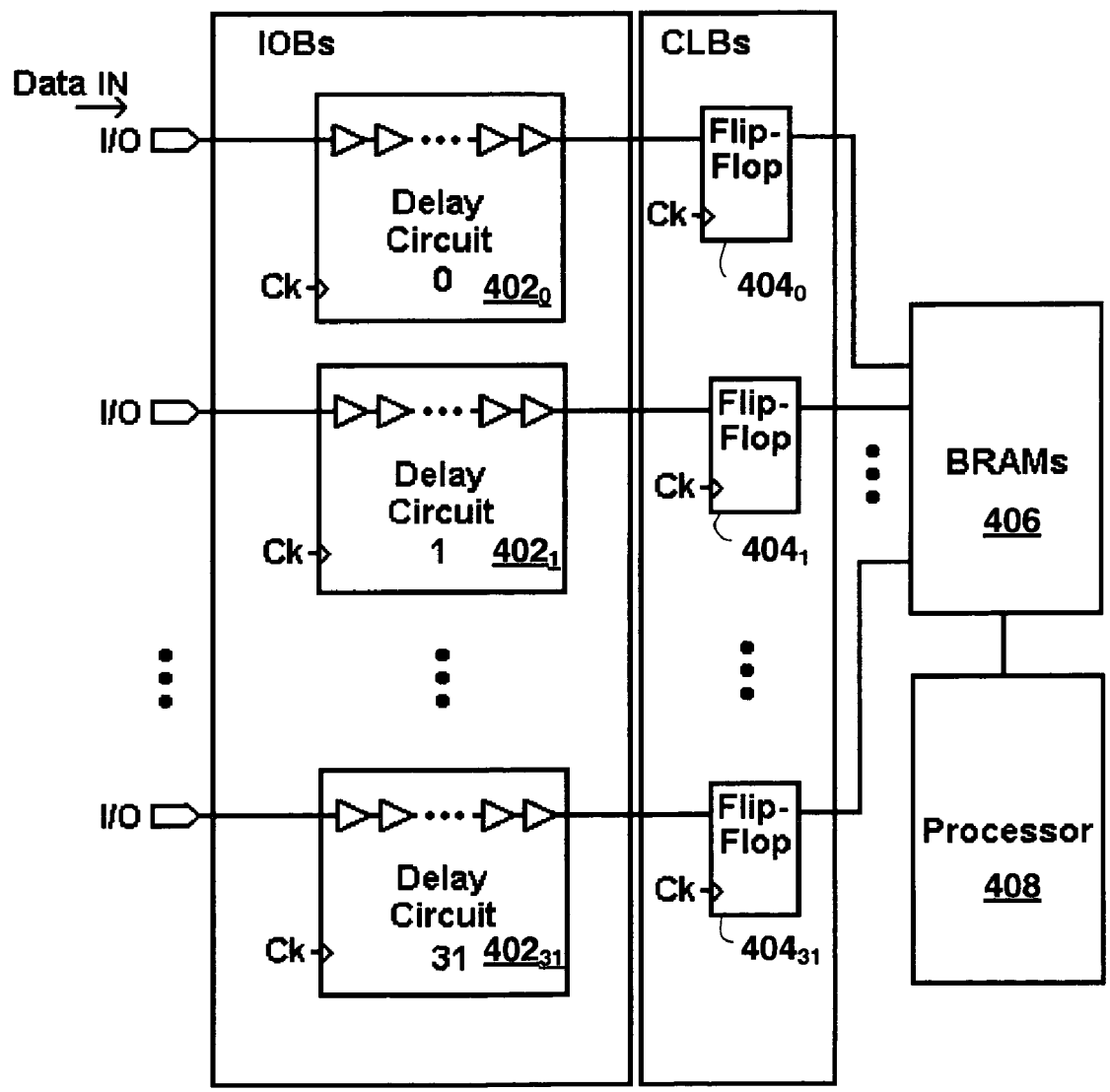
FIG. 4 illustrates the connection of multiple delay circuits to provide for pulse width measurements according to embodiments of the present invention.

FIG. 4 illustrates the connection of multiple delay circuits from FIG. 3 to provide for pulse edge measurement according to embodiments of the present invention. An input signal (Data IN) for which delay is to be measured is separated and provided to multiple IOBs of an FPGA. The pulse may be distributed on a Printed Circuit Board (PCB) and provided to multiple input pins on an FPGA attached to the PCB. The data input pin of each IOB is then provided to a delay circuit. In the one embodiment shown in FIG. 4, 32 separate data signals are provided in IOBs to 32 different delay circuits $402_{0-31}$.

In one embodiment, each of the delay circuit inputs $402_{0-31}$ is a Low Voltage Differential Signal (LVDS) input pair, and each delay circuit output similarly is a differential output. Alternatively a single, or non-differential, input signal may be used. The delay circuits $402_{0-31}$ are programmed in ascending order. In one embodiment with the Xilinx Virtex-4 FPGA utilized, individual delay increments of approximately 80 ps are provided, the first delay circuit provides an 80 ps delay increment, the second provides a 160 ps delay increment, the third a 240 ps delay increment, and so forth.

The outputs of each of the delay circuits are clocked into separate flip-flops $404_{0-31}$ in the CLBs. The 32 outputs of the flip-flops $404_{0-31}$ are then provided to address BRAMs 406. Four BRAMs are then addressed using the 32 delay device outputs. The BRAMs are configured to accept four groups of 8 to 10 bits. In one embodiment, four groups of 9 bits are used to address each port with overlap bit used to detect when a transition falls between two separate sets of BRAM inputs. Four BRAMs can be combined into two dual port BRAMs.

A processor 408 then processes the data addressed from BRAMs 406 to determine the pulse transition time. The data from the BRAMs 406 describe the timing of the input transition. Although BRAMs 406 are shown providing the inputs to the processor 408, and provide a convenient way to extract timing information, the BRAMs 406 are not crucial. The BRAMs simply serve as a code converter rather than purely as a storage device. As an alternative, the data can be provided directly from the flip-flops $404_{0-31}$ to the processor 408 for evaluation. The data provided to the micro-controller, either directly or through a memory device, can be interpreted in operation of the system as described to follow.

In operation, it is assumed that an individual incoming asynchronous pulse is received, and it is desired to measure the width of the pulse with high resolution. In the Virtex-4 FPGA, the pulse is fed into 32 parallel LVDS input pairs, each of them programmed with a different delay value in ascending order. The 32 bits are clocked into the IOB delay circuits, for example at 400 MHz.

Under ideal conditions, the 32 differently delayed inputs will represent either all 0s, all 1s, or a 32-bit word with a single break between adjacent 0s and 1s. Theoretically, there can only be 64 different patterns on these 32 lines since the 32 delayed inputs will transition between 0 and 1 or between 1 and 0 at only one point. The 64 different patterns take into account the pattern of all 0s or all 1s for both the transition from 0 to 1 and from 1 to 0. For example, for a 0 to 1 transition 00000000111111111111111111111111 is a possible output, but 00001111000011110000111100001111 which transitions between 0 and 1 more than one time is not. With four bytes stored in the BRAMs 406 representing data from the delay circuits for each clock cycle, only one of the byte-wide outputs will describe the exact location of the 0-1 or 1-0 transition.

Figure 5A:
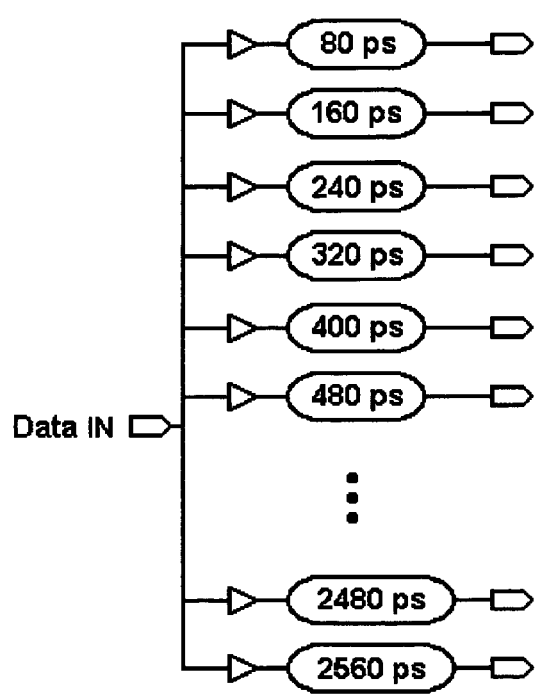
FIGS. 5A–5B illustrate measurement of a pulse transition with high resolution according to embodiments of the present invention.
Figure 5B:
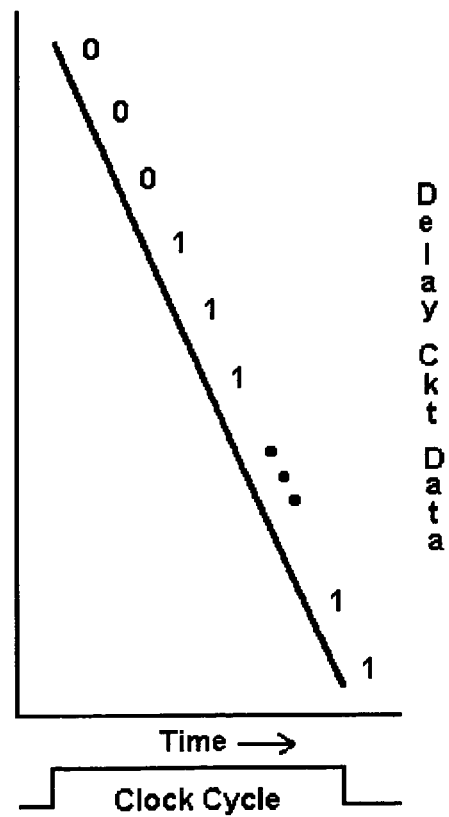

FIGS. 5A–5B illustrate generally measurement of a pulse edge with high resolution according to embodiments of the present invention. As shown in FIG. 5A, the pulse is provided as a Data IN input to a series of delay devices, with each delay being 80 ps greater than the previous in ascending order. The outputs of the delay devices for one clock cycle are illustrated in FIG. 5B. As shown in FIG. 5B, each succeeding output occurs with a slightly greater delay. FIG. 5B illustrates an output where the edge is detected between delay devices 3 and 4. The outputs, thus change from 0 to 1 between delay devices 3 and 4. The output of delay devices in the prior clock cycle would have been all zeros, while during the next clock cycle the outputs will all be one. The first pulse edge, thus, occurred between 240 ps and 320 ps into the clock cycle shown. Similarly, to determine the second pulse edge a change between 1 to 0 between delay devices is determined. Hence, with the time for the first pulse edge and the time for the second pulse edge, the pulse width can be calculated by a processing circuit.

Figure 6:
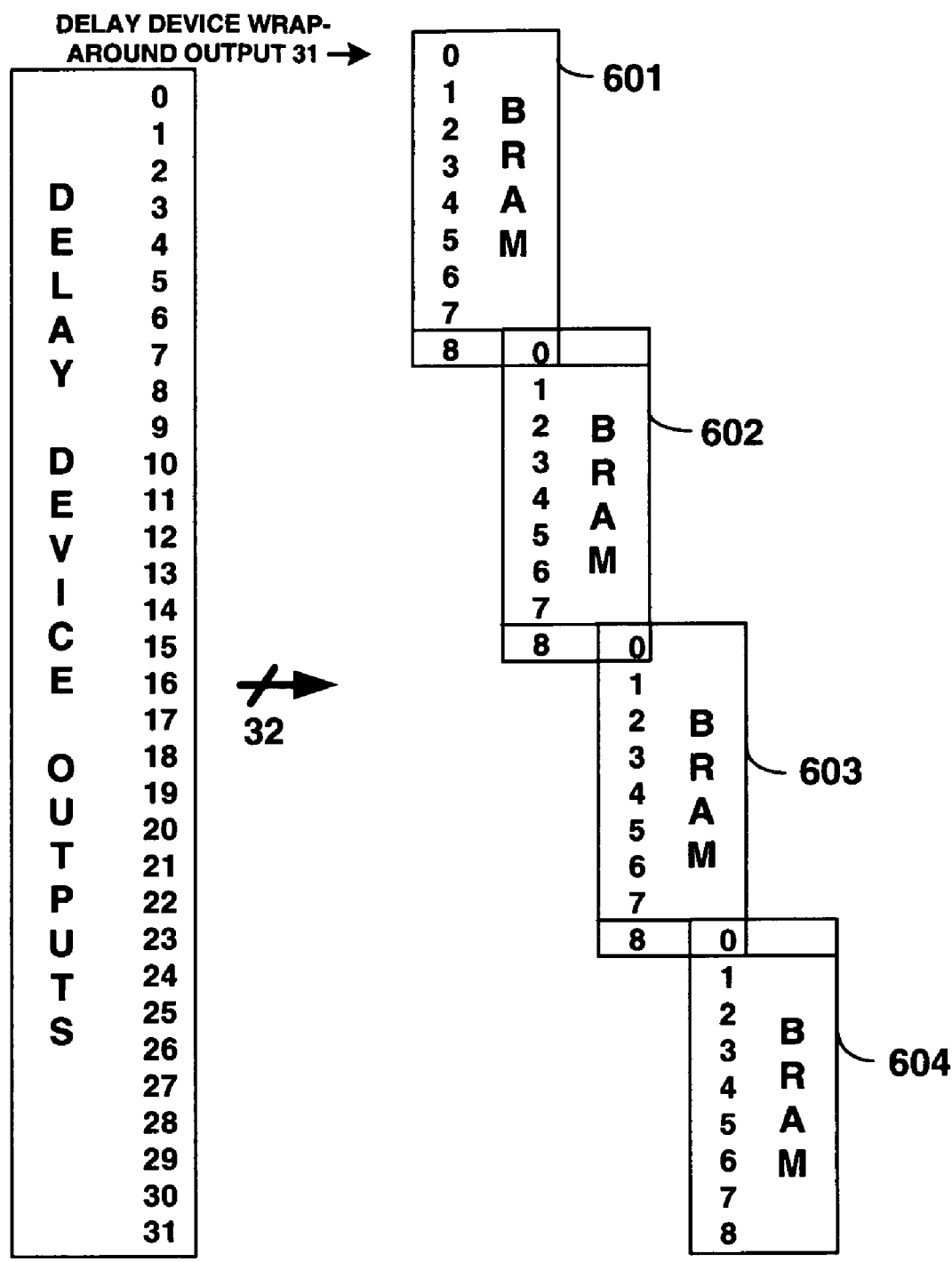
FIG. 6 illustrates one configuration enabling use of a 32 bit delay device output to address four BRAM ports.

FIG. 6 illustrates one configuration enabling use of a 32 bit delay device output to address four BRAMs 601–604. In the configuration illustrated, 9 bits are provided from the delay device outputs to the four separate BRAMs 601–604 with one overlapping bit as described previously. The overlap bit is used to detect when a transition falls between two separate sets of BRAM inputs. The bit 0 of BRAM 601 is provided as a wrap-around from the last bit 31 of the delay device output. Although shown with 9 bit inputs, it is understood that BRAMs 601–604 can be configured to accept more or less inputs with overlap used when necessary to meet desired design requirements.

To determine the delay, the processor 408 reads the data from the BRAM. When the address received for a clock cycle is 0 it indicates all delay circuit outputs were 0, and the address being 32 indicates all the outputs were 1. Any other number read between 0 and 32 indicates a pulse edge occurred during the clock cycle with the number indicating the amount of delay from the clock cycle edge at which the transition occurred. For example, with the output shown in FIG. 5B, the number read would be 29, indicating a clock transition between 240 ps and 320 ps from the leading edge of the clock cycle.

To assure accurate results are maintained, since the programmable delay devices are active devices that have delays varying with time, regular calibration of the programmable delay devices is preferable. With active elements, calibration maintains measurement monotonicity. In one embodiment, calibration can be performed simply by driving a series of asynchronous edges into the inputs with known delay times in-between, and adjusting the programmable delay circuits to maintain monotonicity over many captured edges. With an FPGA including programmable delay circuits as shown in FIG. 3, a calibration delay line can be included internal to the FPGA that is used to continually monitor and reset the delays of the buffers so that a constant delay is maintained at each tap point.

Although the present invention has been described above with particularity, this was merely to teach one of ordinary skill in the art how to make and use the invention. Many additional modifications will fall within the scope of the invention, as that scope is defined by the following claims.

What is claimed is:

1. An integrated circuit (IC) having components for measuring a signal pulse width, the IC comprising:
   a plurality of delay circuits for providing various delays, the delay circuits each having a first terminal connectable to a common terminal to receive the signal pulse, and a second terminal providing a delay circuit output;

a clock signal source connection providing a clock signal to components of the IC;

flip-flops connected to the outputs of the delay circuits and the clock signal source connection, wherein signals from the outputs of the delay circuits are provided to the flip-flops each clock cycle;

a memory connected outputs of the flip-flops; and a processor connected to the memory to receive data stored in a location in the memory as addressed by the signals from the outputs of the delay circuits, wherein timing of receipt of at least an edge of the signal pulse is determined by the processor from the data received from the memory.

2. The IC of claim 1, wherein the delay circuits each have a programmable delay.

3. The IC of claim 1, wherein the IC comprises an FPGA.

4. The IC of claim 1, wherein the delay values are increased by a constant value in each successive delay device in ascending order.

5. The IC of claim 1, wherein the memory comprises random access memory (RAM).

6. The IC of claim 1, wherein the IC further comprises:
input/output buffer (IOB) circuits, the delay devices each being provided in one of the IOBs, and
a plurality of memory devices forming the memory.

7. The IC of claim 6, wherein the outputs of the delay circuits are greater in number than inputs to one of the memory devices, and wherein the memory devices are addressed by the outputs of the delay circuits with at least one of the delay device outputs overlapping between the memory devices.

8. An Integrated circuit (IC) having components for measuring a signal pulse width, the IC comprising:

a plurality of delay circuits each having a programmable delay for providing various delays, the delay circuits each having a first terminal connectable to receive a signal pulse, and a second terminal providing a delay circuit output; and a clock signal source connection providing a clock signal to components of the IC; and a processing circuit connected to the outputs of the delay circuits and the clock source connection, wherein the processing circuit determines timing of receipt of at least an edge of the pulse by taking into account by taking into account the various delays provided by the delay circuits in the clock cycles where a transition of the pulse occurs.

9. The method of claim 8, further comprising:
a memory connected to the delay devices, wherein the processor is connected to the memory to receive data stored in a location in the memory as addressed by the signals from the outputs of the delay circuits, wherein timing of receipt of at least an edge of the signal pulse is determined by the processor from the data received from the memory.

10. The IC of claim 8, wherein the IC comprises an FPGA.

11. The IC of claim 10, wherein the FPGA comprises:
input/output buffer (IOB) circuits, the delay devices each being provided in one of the IOBs.

12. A method of determining pulse width of a signal comprising:
receiving the signal at a terminal of an integrated circuit;
delaying the signal using a plurality of delay circuits providing various delays;
determining timing of receipt of at least an edge of the signal based on transition of outputs of the delay circuit during a clock cycle; and
using the outputs of the delay circuits to address a location in memory, wherein the memory location stores data indicating timing of receipt of at least an edge of the signal.

13. The method of claim 12, wherein the memory comprises multiple memory devices, and when the outputs of the delay circuits are greater in number than inputs to one of the memory devices the method further comprising:
addressed the memory devices with the outputs of the delay circuits with at least one of the delay device outputs overlapping between the memory devices.

14. The method of claim 12, wherein data addressed from the memory is processed to determine timing of receipt of at least an edge of the signal.

* * * * *